United States Patent
Aoki

(10) Patent No.: US 7,586,351 B2
(45) Date of Patent: Sep. 8, 2009

(54) APPARATUS AND METHOD FOR CONTROLLING DELAY OF SIGNAL

(75) Inventor: Mutsumi Aoki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 12/073,514

(22) Filed: Mar. 6, 2008

(65) Prior Publication Data

US 2008/0232178 A1    Sep. 25, 2008

(30) Foreign Application Priority Data

Mar. 20, 2007    (JP)    ............................. 2007-071707

(51) Int. Cl.
*H03H 11/26*    (2006.01)
(52) U.S. Cl. ...................... 327/263; 327/265; 327/276; 327/279
(58) Field of Classification Search ...................... None
See application file for complete search history.

(56) References Cited

U.S. PATENT DOCUMENTS

| | | | |
|---|---|---|---|
| 6,642,762 B2 * | 11/2003 | von Kaenel | ................. 327/158 |
| 7,038,953 B2 | 5/2006 | Aoki | ..................... 365/189.05 |
| 7,106,116 B2 * | 9/2006 | Yamada | ..................... 327/175 |
| 7,336,752 B2 * | 2/2008 | Vlasenko et al. | ............ 375/376 |
| 2005/0047192 A1 | 3/2005 | Matsui et al. | |
| 2005/0213396 A1 | 9/2005 | Aoki | |

FOREIGN PATENT DOCUMENTS

| | | |
|---|---|---|
| JP | 2005-78547 | 3/2005 |
| JP | 2005-276396 | 10/2005 |
| JP | 2006-12363 | 1/2006 |

* cited by examiner

*Primary Examiner*—An T Luu
(74) *Attorney, Agent, or Firm*—McGinn IP Law Group, PLLC

(57) ABSTRACT

An apparatus, includes a counter which counts a frequency of input of a first signal, a delay controller which generates a second signal by adding a delay to the first signal, the delay corresponding to the frequency, and a control circuit which halts the counter counting the frequency, when a phase difference between the first signal and the second signal is a predetermined value.

25 Claims, 7 Drawing Sheets

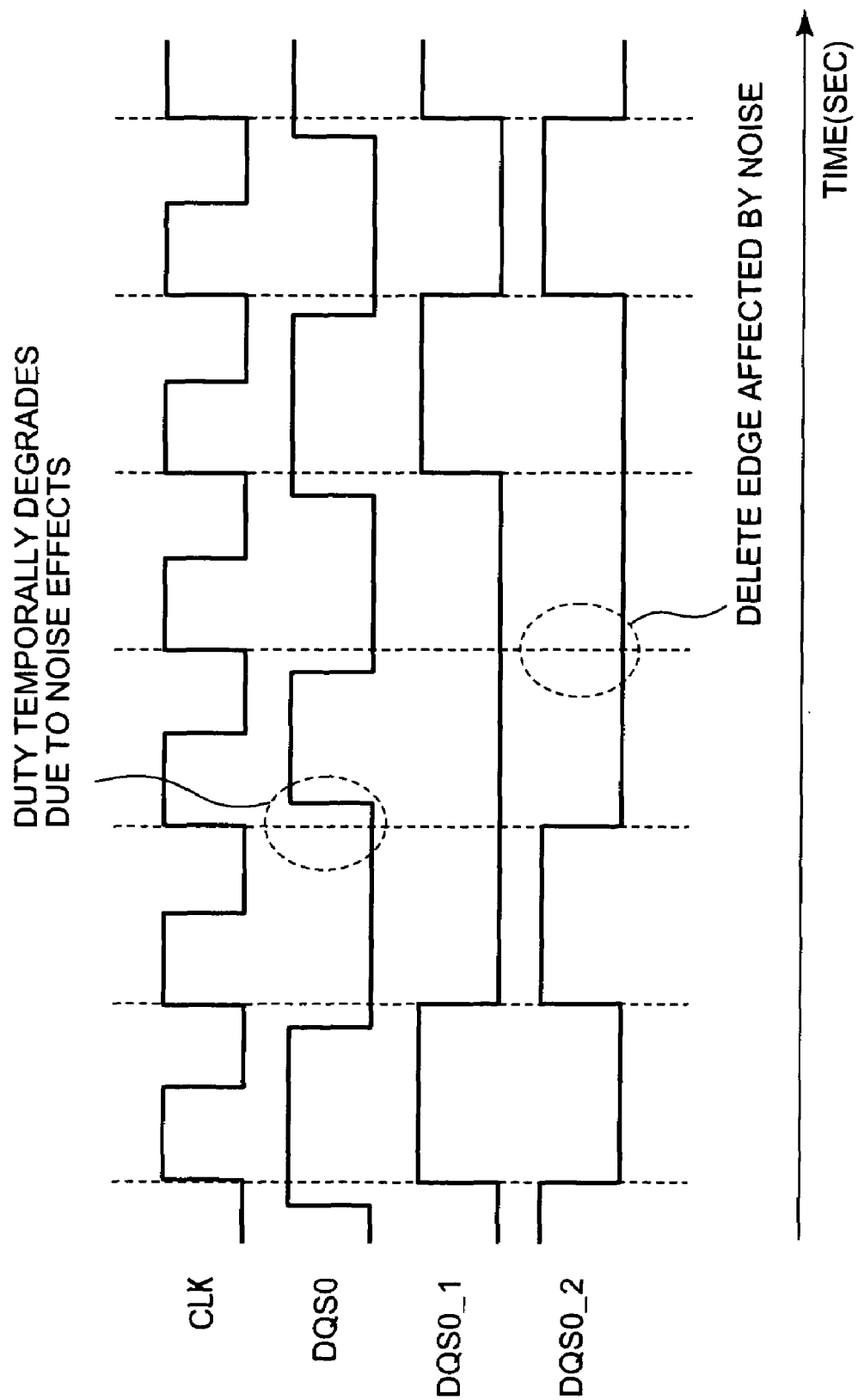

APPARATUS AND METHOD FOR CONTROLLING DELAY OF SIGNAL

INCORPORATION BY REFERENCE

This application is based upon and claims the benefit of priority from Japanese patent application No. 2007-071707, filed on Mar. 20, 2007, the disclosure of which is incorporated herein in its entirety by reference.

BACKGROUND OF THE INVENTION

In recent years, a general-purpose SDRAM (Synchronous Dynamic Random Access Memory) is becoming popular that has a high-speed interface such as in a DDR2-SDRAM or a DDR3-SDRAM. Since the SDRAM is a general-purpose product, the specifications are defined such that the SDRAM has a large timing margin. On the contrary, a timing margin for a memory controller LSI (Large Scale Integrated Circuit) connecting to the SDRAM is very strict. A data strobe signal DQS is outputted in the same phase as a data signal DQn from a DDR2/DDR3-SDRAM. The data strobe signal indicates a timing for transmitting the data signal. Since the phase of the DQS and the DQn are the same, it is difficult to transmit the data signal under this condition.

In the above circumstances, an interface circuit needs to control the shifting of the phase of the data strobe signal by substantially 90°. For the substantially 90°-phase shifting control, a DLL (delay locked loop) circuit is used, for example. However, since the DLL has a large scale circuit, if many DLLs are installed, it increases an area or power consumption of the circuit.

On the other hand, a delay circuit can be provided instead of the DLL. However, it is difficult to optimize a delay amount by the delay circuit. For example, even if the amount is set to a value estimated at the designing of the circuit, the optimal setting might not be achieved due to an unevenness in quality of the interface circuit, temperature change, power voltage change or the like.

Another method generates a calibration pattern for a DDR2/DDR3-SDRAM at power-on by using the delay circuit which is able to change the delay amount, and controls the circuit by pass/fail determination for the optimized delay amount. However, the method needs a circuit for the control of the calibration pattern and the pass/fail determination. Such a circuit increases an area for the delay circuit.

Some examples of this kind of related art are disclosed in Patent Documents 1 to 3.

[Patent Document 1] Japanese Patent Laid-Open No. 2005-078547
[Patent Document 2] Japanese Patent Laid-Open No. 2005-276396
[Patent Document 3] Japanese Patent Laid-Open No. 2006-012363

SUMMARY OF THE INVENTION

According to one exemplary aspect of the present invention, an apparatus includes: a counter which counts a frequency of input of a first signal; a delay controller which generates a second signal by adding a delay to the first signal, the delay corresponding to the frequency; a control circuit which halts the counter counting the frequency, when a phase difference between the first signal and the second signal is a predetermined value.

According to another exemplary aspect of the present invention, an apparatus, comprising: means for counting a frequency of input of a first signal; means for generating a second signal by adding a delay to the first signal, the delay corresponding to said frequency; and means for halting counting said frequency, when a phase difference between the first signal and the second signal is a predetermined value.

According to another exemplary aspect of the present invention, an apparatus which controls a strobe signal for a memory device, the strobe signal indicating a timing for transmitting data, includes: a counter which counts a frequency of input of said strobe signal; a delay controller which generates a delayed strobe signal by adding a delay to the strobe signal, the delay corresponding to the frequency; a control circuit which halts the counter counting the frequency, when a phase difference between the strobe signal and the delayed strobe signal is a predetermined value.

According to yet another exemplary aspect of the present invention, a method includes: counting a frequency of an input of a first signal; generating a second signal by adding a delay to the first signal, the delay corresponding to the frequency; halting counting the frequency, when a phase difference between the first signal and the second signal is a predetermined value.

BRIEF DESCRIPTION OF THE DRAWINGS

Other exemplary aspects and advantages of the invention will be made more apparent by the following detailed description and the accompanying drawings, wherein:

FIG. 7 is a timing chart showing an exemplary operation of a synchronization circuit 16 when a strobe signal DQS0 is affected by noise.

DETAILED DESCRIPTION OF THE EXEMPLARY EMBODIMENTS

The present invention relates to an apparatus including a delay control circuit and a memory interface control circuit using the delay control circuit, and particularly to a delay control circuit provided between a double data rate synchronous DRAM such as a DDR (double data rate) 2/DDR3-SDRAM (synchronous dynamic random access memory) and an LSI (large scale integrated circuit).

The related arts (including the inventions disclosed in the above mentioned Patent Documents 1 to 3) have a drawback that a circuit area and the power consumption of LSI for a high-end server or a super computer increase. Because the LSI for a high-end server or a super computer has a large number of memory controllers, the circuit area and the power consumption of the LSI increase. The related arts also have a problem that it is difficult to optimize a delay amount by a delay circuit.

It is an exemplary purpose of the present invention to provide an apparatus including a delay control circuit that is able to reduce the circuit area and the power consumption and optimize the delay amount.

Figure 1:
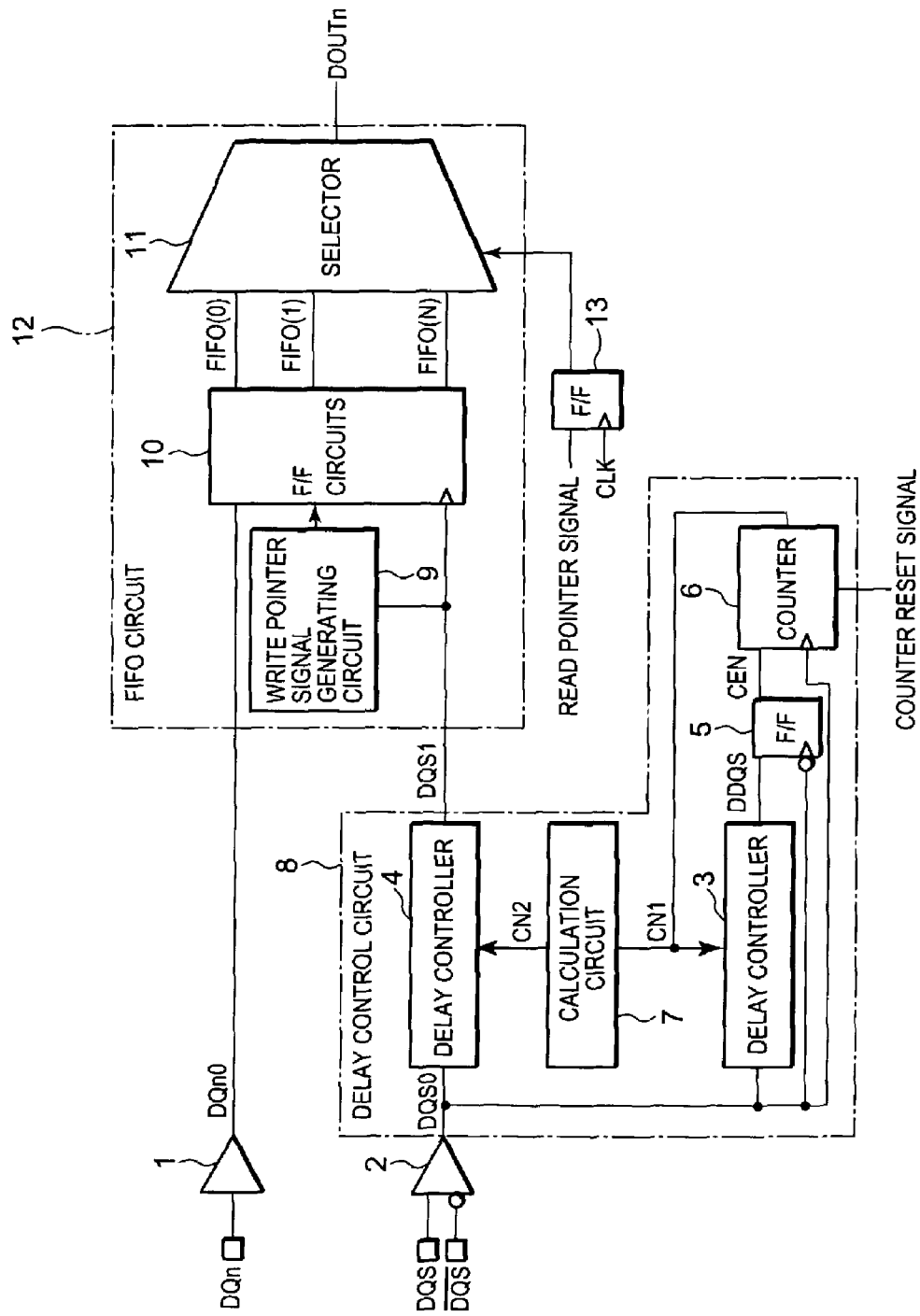
FIG. 1 is a block diagram illustrating the configuration according to an first exemplary embodiment of the present invention.

FIG. 1 is a configuration diagram of an first exemplary embodiment of the memory interface control circuit according to the present invention. As shown in FIG. 1, the first exemplary embodiment of the memory interface control circuit according to the present invention includes an I/O buffer 1, an I/O buffer 2, a delay control circuit 8, a FIFO (first-in first-out) circuit 12 and a flip-flop (F/F) 13.

The I/O buffer 1 may be a single-end input buffer for receiving a data signal DQn read out from a DDR2/DDR3-SDRAM, for example. The I/O buffer 1 outputs a signal DQn0. The I/O buffer 2 may be a differential input buffer for receiving a data strobe signal DQS read out from a DDR2/DDR3-SDRAM and the opposite phase signal, for example. The I/O buffer 2 outputs a data strobe signal DQS0. The data signal DQn and the data strobe signal DQS are in the same phase.

Although the I/O buffers 1 and 2 are essentially bidirectional buffers, they are described as input buffers since the present invention is an invention for an input side. As such, the I/O buffers 1 and 2 can also be configured as bidirectional buffers.

The FIFO circuit 12 includes a write pointer signal generating circuit 9, a flip-flop (F/F) circuit 10 and a selector 11.

The F/F circuit 10 receives a data signal DQn0, a strobe signal DQS1 which is delayed by a certain amount, and an output signal from the write pointer signal generating circuit 9. The selector 11 receives respective data (FIFO(0), FIFO(1), . . . , FIFO(n) (n is a positive integer)) from the flip-flop (F/F) circuits 10.

Also, the selector 11 receives a signal corresponding to a read pointer signal via the flip-flop (F/F) 13. And, the selector 11 outputs data (any of FIFO(0), FIFO(1), . . . , FIFO(n)) corresponding to a read pointer signal as a signal DOUTn. The read pointer signal may be a logic signal of a memory controller LSI which includes the memory interface control circuit of the present invention.

The delay control circuit 8 includes a delay controller 3 and a delay controller 4, a calculation circuit 7, a flip-flop (F/F) 5 and a counter 6.

The delay amount which is added to the strobe signal increases in stages (e.g., is larger in downstream stages) corresponding to a counter value of the counter 6.

The flip-flop (F/F) 5 receives a signal DDQS from the delay controller 3, and the strobe signal DQS0 as a clock signal. The flip-flop 5 receives the DQS0 so that the phase of DQS0 is reversed. The flip-flop 5 captures the signal DDQS according to the phase reversed DQS0. The flip-flop 5 outputs the captured signal as the count-up enable signal CEN to the counter 6. The count-up enable signal CEN indicates whether the counter 6 counts the counter value or not. The flip-flop 5 may be able to halt the counter 6 count the counter value according to the count-up enable signal CEN. In other words, the flip-flop 5 may be a control circuit for controlling the counting operation of the counter 6.

The counter 6 counts a frequency of input of the strobe signal DQS0. In other words, the counter 6 counts the number of input(s) of the strobe signal DQS0. The counter 6 receives the count-up enable signal CEN from the flip-flop 5. The counter 6 counts the frequency while the count-up enable signal CEN is asserted. The counter 6 sends the counter value to the delay controller 3 as a signal CN1, and sends the counter value to the calculation circuit 7 as a signal CN2. The counter 6 stops counting the frequency after the count-up enable signal CEN is negated.

The calculation circuit 7 divides the counter value sent from the counter 6 as the signal CN1. In this embodiment, the calculation circuit 7 divides the counter value by 2. However, the invention is not limited to the calculation circuit 7 dividing the counter value by 2. The calculation circuit 7 sends the divided counter value to the delay controller 4 as a signal CN2.

Figure 2:
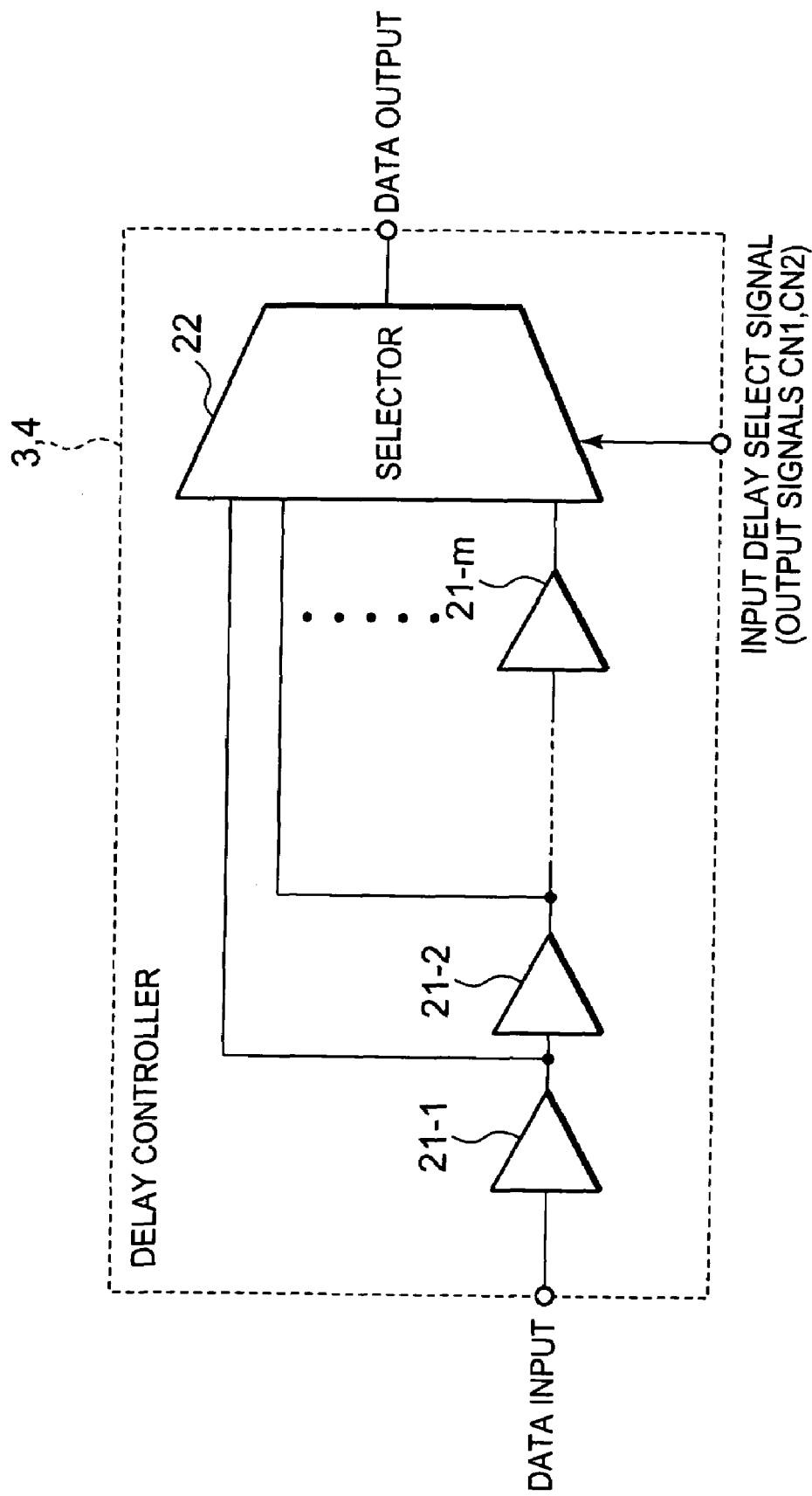
FIG. 2 is a block diagram illustrating the configuration of a delay circuit 8 of the first exemplary embodiment.

Next, an example of a configuration of the delay controllers 3 and 4 will be described, with referring to FIG. 2. Referring to FIG. 2, the exemplary configuration of the delay controllers 3 and 4 include m (m is a positive integer) delay elements (21-1 to 21-m) and a selector 22. The respective delay elements (21-1 to 21-m) are connected in series. The selector 22 receives the signal CN1 or CN2, which is sent from the delay controller 3 or 4, as a delay select signal.

As an example, it is assumed that a delay amount of each of the delay elements (21-1 to 21-m) is D (sec). The selector 22 receives the signal indicating the delay amount D from the delay element 21-1, the signal indicating the delay amount 2D from the delay element 21-2, . . . , the signal indicating the delay amount mD from the delay element 21-m. The selector 22 selects the signal from any of the delay elements (21-1 to 21-m) according to the counter value sent from the delay controller 3 as a signal CN1 according to the counter value or sent from the delay controller 4 as a signal CN2.

Next, an operation of the first exemplary embodiment of the present invention will be described. Referring to FIG. 1, the FIFO circuit 12 transmits the data signals DQn according to the strobe signals DQS in the order of being captured according to the read pointer signal sent from the write pointer signal generating circuit 9.

However, as discussed in the above, the strobe signals DQS are outputted from the DDR2/DDR3-SDRAM in the same phase as the data signals DQn. As such, if the FIFO circuit 12 receives the strobe signal DQS without the delay, the timing to receive the data signals DQn is too strict. Therefore, the FIFO circuit 12 receives the strobe signal DQS1 to which the delay is added by the delay control circuit 8. The delay is substantially 90°. However, the invention is not limited to the delay being substantially 90°.

The configuration of the first exemplary embodiment has been described in detail above. However, the configurations of the write pointer signal generating circuit 9, the F/F circuits 10, the selector 11 and the flip-flop (F/F) 13 for receiving a read pointer signal that constitute the FIFO circuit 12 are well known to those skilled in the art, and do not directly relate to the feature of the present invention. Therefore, such configurations are not further described herein.

Figure 3:
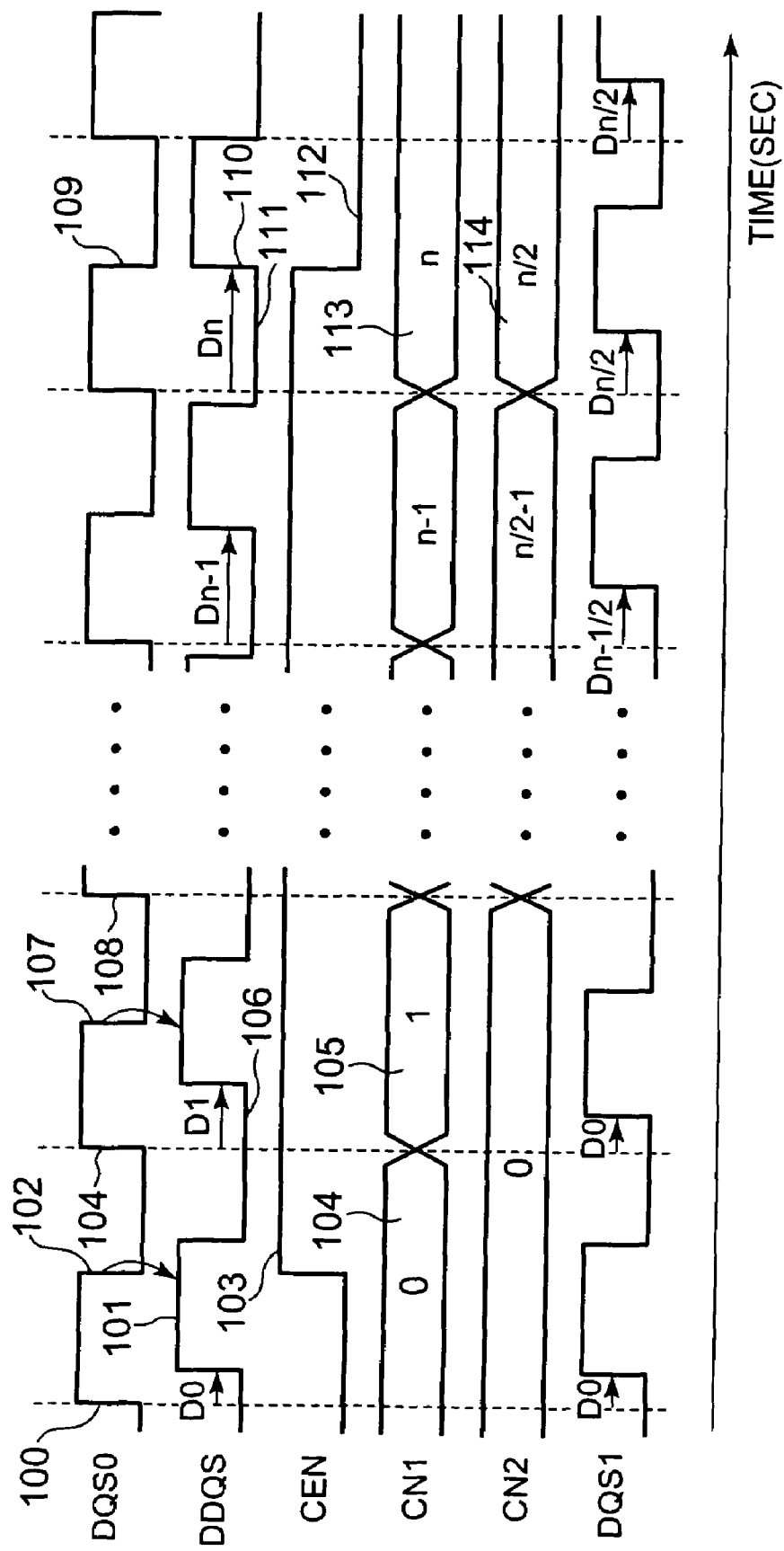
FIG. 3 is a timing chart of the first exemplary embodiment.

Next, an example of an operation of the delay control circuit 8 will be described with referring to FIG. 3 which is a timing chart. In FIG. 3, a longitudinal axis indicates the level (mV) of signals DQS0, DDQS, CEN, CN1, CN2 and DQS1, and a horizontal axis indicates time (sec.).

First, an outline of the operation will be described. The flip-flop 5 captures the strobe signal DDQS, to which the delay is added by the delay controller 3, according to the strobe signal DQS0 whose phase is reversed. In other words, the strobe signal DQS0 is used as the clock signal of the flip-flop 5. The flip-flop 5 captures the strobe signal DDQS at the timing of the falling edge of the strobe signal DQS0. The flip-flop 5 captures the strobe signal DDQS at the timing of the rising edge of the clock signal. In this embodiment, the reversed DQS0 is input to the flip-flop 5 as the clock signal. Therefore, the timing for capturing the strobe signal DDQS is equal to the timing of the falling edge of the not-reversed DQS0. The flip-flop 5 outputs the count-up enable signal CEN to the counter 6. Therefore, when the phase difference between the strobe signal DQS0 and the strobe signal DDQS becomes substantially 180°, the level of DDQS captured by the flip-flop 5 is low, and then, the count-up enable signal CEN becomes low. In other words, the delay amount which is added by the delay controller 3 is fixed at substantially 180°, since the counter 6 stops to count the frequency of input of the strobe signal DQS0 after the count-up enable signal CEN is negated.

A counter value CN1 of the counter 6 is used as the delay select signal of the delay controller 3. The counter value CN2 which is calculated by the calculation circuit 7 is used as the delay select signal of the delay controller 4. In this embodiment, the counter value CN2 is substantially half of the counter value CN1.

As a result, a signal DQS1 being output from the delay controller 4 is a desired signal and is a phase shifted by substantially 90° from a data strobe signal DQS0. The timing chart in FIG. 3 illustrates a state after the counter 6 is initialized with a counter reset signal.

Next, details of the operation will be described. In FIG. 3, it is assumed that the delay amount corresponding to each of the delay elements (21-1, . . . , 21-$m$) of the delay controllers 3 and 4 is D0 (sec.). In the initial state, when a high-level signal (100) is inputted to the delay controller 3 at the timing of the first rising edge (100) of the strobe signal DQS0, the signal DDQS (101) is outputted that is delayed by D0 with respect to the strobe signal DQS0.

The flip-flop (F/F) 5 outputs a high-level signal (103) as the count-up enable signal CEN at the timing of the first falling edge (102) of the strobe signal DQS0, since a signal level (101) of the strobe signal DDQS is a high-level. The counter 6 starts to count according to the high-level signal (103). The high-level signal corresponds to the count-up enable signal CEN. In the initial state, a counter value of the counter 6 is set to "0" (see reference numeral 104 in FIG. 3), a counter value "0" is outputted as a signal CN1 to the delay controller 3.

The counter 6 counts by "1" at the timing of the second rising edge (104) of the strobe signal DQS0 (see reference numeral 105 in FIG. 3), and outputs a counter value "1" as the signal CN1 to the delay controller 3. At that time, a delay amount of the delay controller 3 is (D0+D0), i.e. D1 (see reference numeral 106 in FIG. 3). Therefore, a signal DDQS with the delay amount D1 is outputted from the delay controller 3.

The flip-flop (F/F) 5 outputs the high-level signal (103) as the count-up enable signal CEN, since the signal level (101) of the strobe signal DQS0 is still a high-level at the timing of the second falling edge (107) of DQS0.

The counter 6 counts by "2" at the timing of the third rising edge (108) of the strobe signal DQS0 (not shown in FIG. 3), and outputs the counter value "2" as the signal CN1 to the delay controller 3. At that time, a delay amount of the delay controller 3 is (D0+D0+D0), i.e. D2 (not shown). Therefore, a signal DDQS with the delay amount D2 is outputted from the delay controller 3.

Afterward, a similar count-up operation is repeated. When the phase difference between the strobe signal DQS0 and the strobe signal DDQS becomes substantially 180° (see reference numerals 109 and 110 in FIG. 3), the flip-flop 5 changes a level of the output signal CEN from a high-level to a low level (112) at the timing of an (n+1)-th falling edge (109) of the strobe signal DQS0 since a level of the signal DDQS has varied to a low level (111).

At the above-mentioned time, a counter value of the counter 6 is "n". However, since the flip-flop 5 has received the count-up enable signal CEN of the low level, the count-up operation is stopped.

Since the counter 6 stops the count-up operation at the counter value "n", the delay amount of the delay controller 3 is fixed to Dn afterward even if the following strobe signals DQS0 are inputted to the delay controller 3.

On the other hand, since a half value of a counter value of the counter 6 is inputted to the delay controller 4 via the calculation circuit 7, a counter value inputted to the delay controller 4 is "n/2" (see reference numeral 114 in FIG. 3) when the counter value of the counter 6 is "n" (see reference numeral 113 in FIG. 3). Therefore, the delay amount of a signal DQS1 outputted from the delay controller 4 is fixed to the half value of the delay amount of the strobe signal DDQS outputted from the delay controller 3, i.e. substantially 90°.

In other words, the phase difference between a strobe signal DQS0 and a strobe signal DQS1 is fixed to substantially 90°. This results in the phase difference between the data signal DQn and the strobe signal DQS1 being fixed to substantially 90°.

In this embodiment, a half value of the counter value CN1 is inputted to the delay controller 4 as the signal CN2. However, a divisional ratio of the counter value CN1 is not limited to 1/2, it is able to be set to any value (for example, 1/3, 1/4, etc.).

As described in the above, a first benefit of the first exemplary embodiment of the present invention is that a timing margin for reading memory data is improved. That is, an optimal delay control of the strobe signal DQS (i.e. substantially 90°-phase shift) can be accomplished.

A second benefit is that a circuit size is reduced. That is, a conventional DLL circuit or memory initializing calibration control circuit, which is configured with a large amount of circuits, is avoided.

A third benefit is that power consumption is reduced. That is, a conventional DLL circuit or memory initializing calibration control circuit, which has higher power consumption because of a large amount of circuits, is avoided.

A benefit of the first exemplary embodiment is not limited to these benefits.

Figure 4:
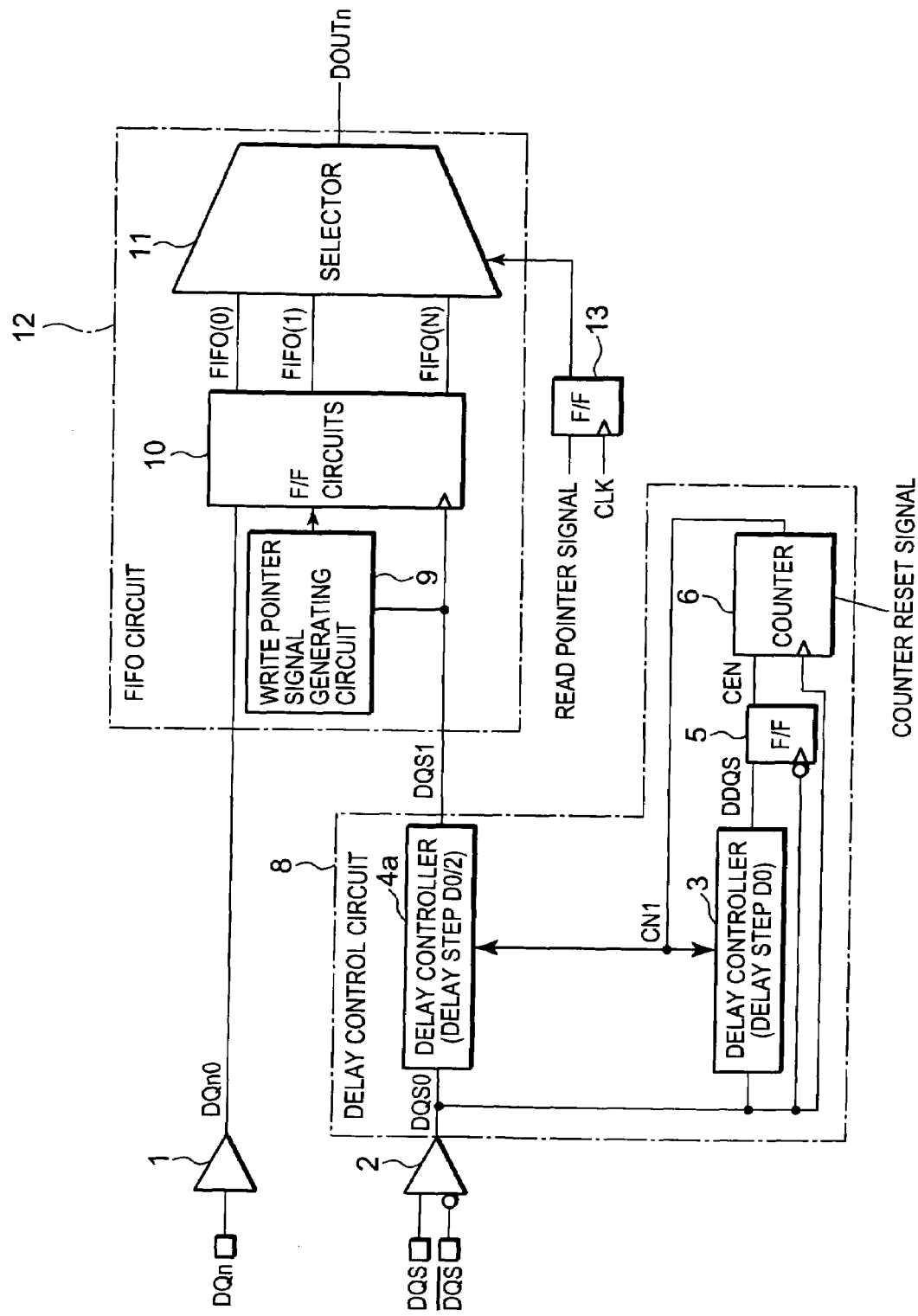
FIG. 4 is a block diagram illustrating the configuration according to an second exemplary embodiment of the present invention.

FIG. 4 is a configuration diagram of a second exemplary embodiment of the present invention. Similar components in the drawing to those in FIG. 1 are denoted by the same reference numerals and will not be further described herein.

Referring to FIG. 4, the second exemplary embodiment does not include the calculation circuit 7, and the delay controller 4 is replaced with a delay controller 4$a$ with a delay step D0/2. In other words, the delay amount of each of the delay elements (21-1, . . . , 21-$m$) of the delay controller 4$a$ is half of each of the delay elements of the delay controller 4 of the first exemplary embodiment. The delay controllers 3 and 4 have the same delay step of D0 as in the first exemplary embodiment, while the delay controller 4$a$ has a half delay step compared to the delay controller 3 in the second exemplary embodiment. As such, the second exemplary embodiment dispenses with the calculation circuit 7 used in the first exemplary embodiment. Therefore, the delay controller 4$a$ outputs a half delay compared to the delay controller 3.

As described above, according to the second exemplary embodiment of the present invention, the calculation circuit 7 is unnecessary.

Figure 5:
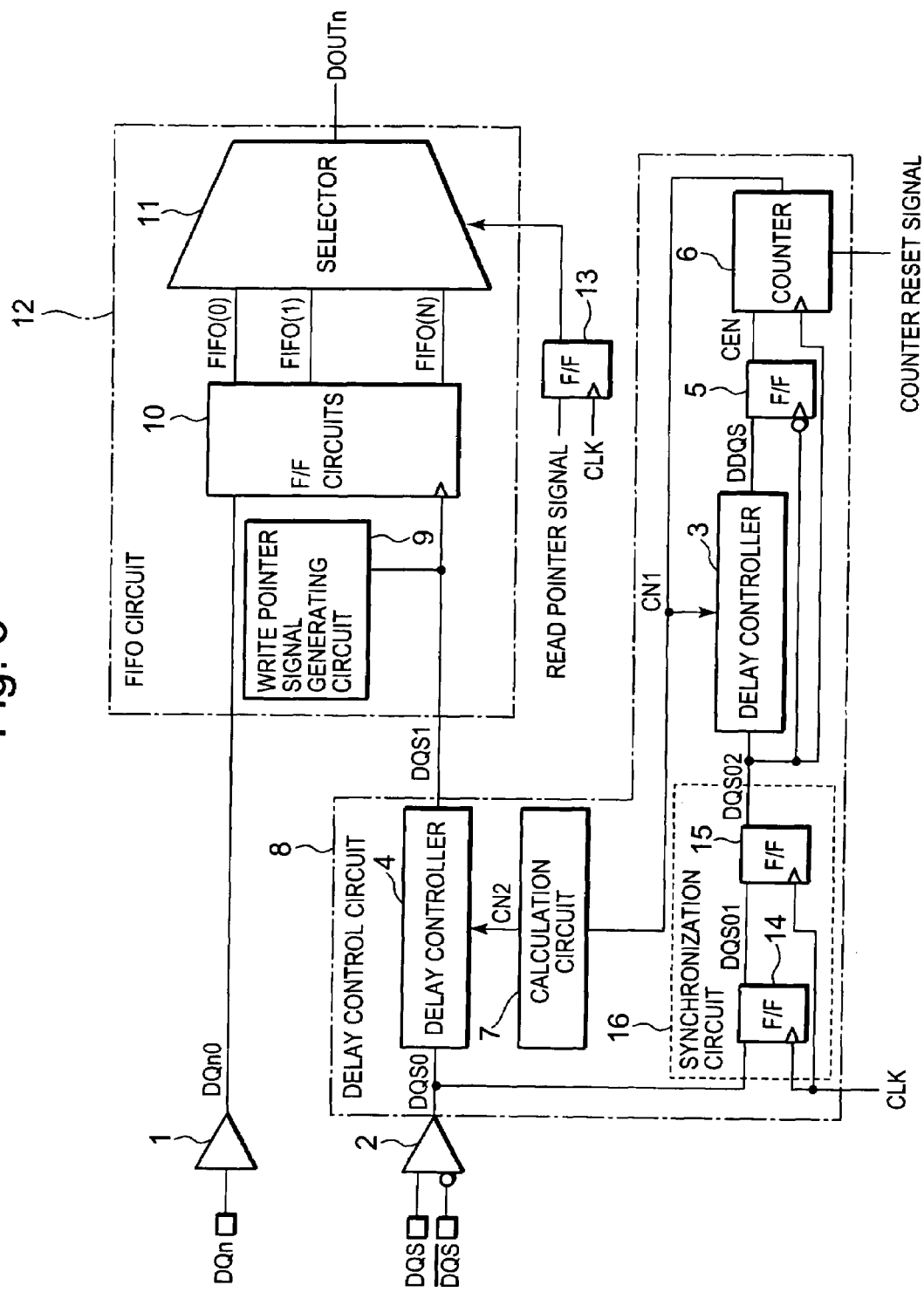
FIG. 5 is a block diagram illustrating the configuration according to an third exemplary embodiment of the present invention.

FIG. 5 is a configuration diagram of a third exemplary embodiment of the present invention. Similar components in the drawing to those in FIG. 1 are denoted by the same reference numerals and will not be further described herein.

Referring to FIG. 5, in the third exemplary embodiment, a synchronization circuit 16 is added to the configuration of the first exemplary embodiment (see FIG. 1). The synchronization circuit 16 includes a flip-flop (F/F) 14 and a flip-flop (F/F) 15, in which an output signal DQS02 from the synchronization circuit 16 is outputted to the delay controller 3, the flip-flop (F/F) 5 and the counter 6.

Figure 6:
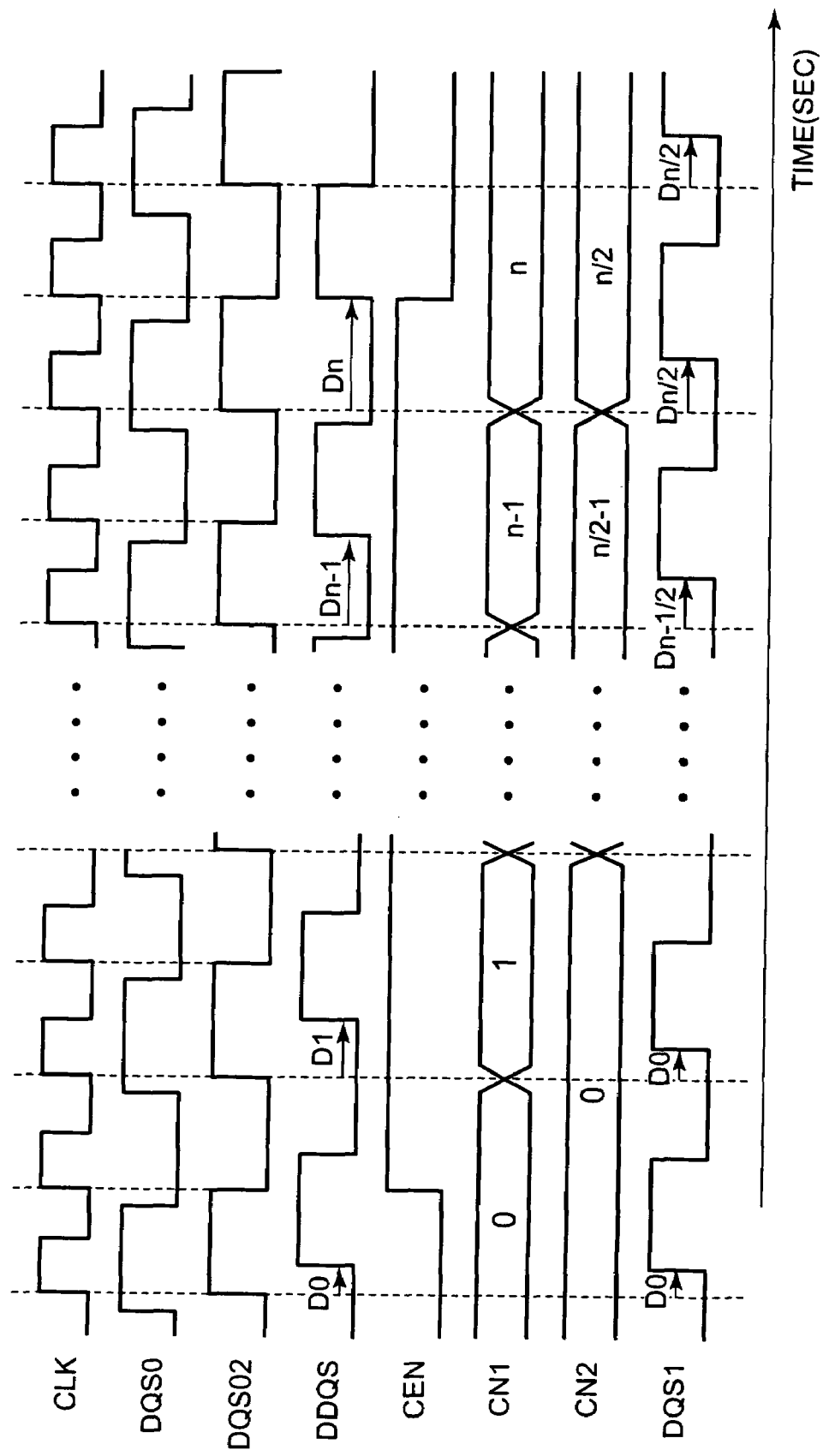
FIG. 6 is a timing chart showing an exemplary operation of the third exemplary embodiment.

FIG. 6 is a timing chart showing an operation of the third exemplary embodiment of the delay control circuit 8. In FIG. 6, a signal CLK represents a clock signal inputted to the flip-flops (F/F) 13-15, and a signal DQS02 represents an output signal from the flip-flop (F/F) 15. The other signals are similar to those in FIG. 3.

The strobe signal DQS may be an LSI external signal transmitted from a DDR2/DDR3-SDRAM, including a problem of being sensitive to a noise and jittery compared to a clock signal CLK inside the LSI.

Therefore, when the duty ratio or a cross-point of the strobe signal DQS temporally degrades due to a noise, a rising edge of the strobe signal DDQS exceeds a falling edge of the strobe signal DQS0 in the state of being smaller than the delay amount originally detected, thereby holding the counter 6. Therefore, when the duty ratio or a cross-point of the strobe signal DQS temporally degrades due to a noise, the flip-flop 5 detects that the level of the strobe signal DDQS is low at the timing of the falling edge of the strobe signal DQS0, before the delay amount added to the DDQS reaches a preferable delay amount. Then, the counter 6 is held.

Therefore, the synchronization circuit 16 synchronizes the strobe signal DQS0 with the clock signal CLK, which is an internal clock signal of the memory controller LSI and which has lower jitter than the strobe signal DQS, and the output signal DQSO2 is used as a clock input of the delay controller 3, the flip-flop (F/F) 5 and the counter 6. By deleting rising and falling edges of a signal DQS affected by a noise, a stable operation is performed.

FIG. 7 is a timing chart showing an exemplary operation of the synchronization circuit 16 when the strobe signal DQS0 is affected by noise. In FIG. 7, the longitudinal axis represents the level (mV) of a signal CLK, a signal DQS0, a signal DQSO1 and a signal DQSO2, while the horizontal axis represents time (sec.).

A signal CLK represents a clock inputted to the flip-flops (F/F) 13-15, a signal DQS0 represents the strobe signal, a signal DQSO1 represents an output signal from the flip-flop (F/F) 14, and a signal DQSO2 represents an output signal from the flip-flop (F/F) 15.

As shown in FIG. 7, when the duty ratio of a signal DQS0 temporally degrades due to a noise, the flip-flops (F/F) 14 and 15 in the synchronization circuit 16 delete a component (edge) of a signal DQSO2 corresponding to a component affected by the noise of the signal DQS0.

FIG. 5 illustrates the configuration of the delay control circuit 8 similar to the first exemplary embodiment. However, the delay control circuit 8 can be configured similarly to the delay control circuit 8 of the second exemplary embodiment. In FIG. 5, the synchronization circuit 16 includes a typical configuration in that the flip-flops (F/F) are arranged in two stages in series. However, a three-stage configuration also is possible to reduce the probability of synchronization mistakes. Moreover, it is possible to configure the number of the flip-flop (F/F) stages to one stage, if the phase difference between the strobe signal DQS0 and the clock signal CLK is able to be correctly estimated and a meta-stable state is not apparently achieved.

As described above, according to the third exemplary embodiment of the present invention, it is possible to prevent a change of rising timing of the signal DDQS due to the strobe signal DQS being affected by a noise and hence jittery.

While this invention has been described in conjunction with the exemplary embodiments described above, it will now be possible for those skilled in the art to put this invention into practice in various other manners.

A delay control circuit according to the present invention may be a delay control circuit for delaying and outputting binary signals by a pre-determined time, which may include: a counter for counting the binary signals; first and second delay elements to which the binary signals are inputted in which the delay amount increases in stages depending on the counter value by the counter; and a counting controller for monitoring phases of the binary signals and a signal outputted from the first delay element, and for stopping the counting by the counter when the phase difference is substantially 180 degrees, wherein the delay amount by the second delay element is a value produced by dividing the delay amount by the first delay element by an integer.

A memory interface control circuit according to the present invention may be a memory interface control circuit provided between a memory and an integrated circuit, which may include: a counter for counting binary signals read out from the memory; first and second delay element to which the binary signals are inputted in which the delay amount increases in stages depending on the counter value by the counter; and a counting controller for monitoring phases of the binary signals and a signal outputted from the first delay element, and for stopping the counting by the counter when the phase difference is substantially 180 degrees, wherein the delay amount by the second delay element is a value produced by dividing the delay amount by the first delay element by an integer.

Next, an exemplary operation of the present invention will be discussed. Referring to FIG. 1, the delay control circuit 8 according to the present invention includes delay controllers 3 and 4 in which the delay amount increases in stages (e.g., step-wise) depending on the counter value by the counter 6. the data signal DQn and the strobe signal DQS are in the same phase.

To the delay controller 3, the strobe signal DQS0 is inputted. Each time the strobe signal DQS0 is inputted, the counter 6 performs a count-up (e.g., a counter value is incremented). When the phase difference between the strobe signal DQS0 and the signal DDQS outputted from the delay controller 3 is substantially 180°, counter 6 stops the count-up.

Meanwhile, the strobe signal DQS0 is also inputted to the delay controller 4. However, the delay controller 4 is configured to receive an input of a half value of the counter value by the counter 6 by the calculation circuit 7.

A signal outputted from the delay controller 4 is denoted by DQS1. When the phase difference between the strobe signal DQS0 and the signal DDQS is substantially 180°, the phase difference between the strobe signal DQS0 and the signal DQS1 is substantially 90°. The signal DQS1 with the phase difference substantially 90° is inputted to the FIFO circuit 12.

According to the present invention, the above configuration is included so that a circuit area and the power consumption can be reduced and the delay amount by the delay controller can be optimized.

It is noted that applicant's intent is to obtain all equivalents.

What is claimed is:

1. An apparatus, comprising:
a counter which counts a frequency of input of a first signal;
a delay controller which generates a second signal by adding a delay to said first signal, said delay corresponding to said frequency; and a control circuit which halts said counter counting said frequency, when a phase difference between said first signal and said second signal is a predetermined value.

2. The apparatus according to claim 1, wherein said control circuit asserts a control signal while said phase difference is smaller than said predetermined value, said control signal indicating that said counter counts said frequency.

3. The apparatus according to claim 1, wherein said control circuit asserts a control signal while said second signal is at a high level at a timing of a falling edge of said first signal, said control signal indicating that said counter counts said frequency.

4. The apparatus according to claim 1, wherein said control circuit asserts a control signal while said second signal is at a low level at a timing of a rising edge of said first signal, said control signal indicating that said counter counts said frequency.

5. The apparatus according to claim 1, wherein said control circuit receives a timing signal which comprises a phase reversal signal of said first signal, and
wherein said control circuit captures said second signal at a timing of a rising edge of said timing signal, and outputs said captured second signal to said counter, said captured second signal indicating whether said counter counts said frequency or not.

6. The apparatus according to claim 5, wherein said delay added to said first signal by said delay controller is smaller than a phase difference of substantially 180 degrees between said first signal and said second signal, and
wherein said control circuit outputs said captured second signal indicating that said counter halts from counting said frequency when said delay reaches to substantially 180 degrees.

7. The apparatus according to claim 1, wherein said delay controller comprises:
a first delay controller which generates said second signal by adding a first delay to said first signal, said first delay corresponding to said frequency; and
a second delay controller which generates a third signal by adding a second delay to said first signal, said second delay corresponding to an adjusting value, said adjusting value being calculated by dividing said frequency by an arbitrary integer.

8. The apparatus according to claim 1, further comprising:
a synchronization circuit which synchronizes said first signal and a clock signal, and outputs said first signal being synchronized with said clock signal, to said delay controller.

9. An apparatus, comprising:
means for counting a frequency of input of a first signal;
means for generating a second signal by adding a delay to said first signal, said delay corresponding to said frequency; and
means for halting said means for counting to count said frequency, when a phase difference between said first signal and said second signal is a predetermined value.

10. An apparatus which controls a strobe signal for a memory device, said strobe signal indicating a timing for transmitting data, comprising:
a counter which counts a frequency of input of said strobe signal;
a delay controller which generates a delayed strobe signal by adding a delay to said strobe signal, said delay corresponding to said frequency; and
a control circuit which halts said counter counting said frequency, when a phase difference between said strobe signal and said delayed strobe signal is a predetermined value.

11. The apparatus according to claim 10, wherein said control circuit asserts a control signal while said phase difference is smaller than said predetermined value, said control signal indicating that said counter counts said frequency.

12. The apparatus according to claim 10, wherein said control circuit asserts a control signal while said delayed strobe signal is at a high level at a timing of a falling edge of said strobe signal, said control signal indicating that said counter counts said frequency.

13. The apparatus according to claim 10, wherein said control circuit asserts a control signal while said delayed strobe signal is at a low level at a timing of a rising edge of said strobe signal, said control signal indicating that said counter counts said frequency.

14. The apparatus according to claim 10, wherein said control circuit receives a timing signal which comprises a phase reversal signal of said strobe signal, and
wherein said control circuit captures said delayed strobe signal at a timing of a rising edge of said timing signal, and outputs said captured delayed strobe signal to said counter, said captured delayed strobe signal indicating whether said counter counts said frequency or not.

15. The apparatus according to claim 14, wherein said delay added to said strobe signal by said delay controller is smaller than a phase difference of substantially 180 degrees between said strobe signal and said delayed strobe signal, and
wherein said control circuit outputs said captured signal indicating that said counter halts counting said frequency when said delay reaches to substantially 180 degrees.

16. The apparatus according to claim 10, wherein said delay controller comprises:
a first delay controller which generates said delayed strobe signal by adding a first delay to said strobe signal, said first delay corresponding to said frequency; and
a second delay controller which generates a third signal by adding a second delay to said strobe signal, said second delay corresponding to an adjusting value, said adjusting value being calculated by dividing said frequency by an arbitrary integer.

17. The apparatus according to claim 10, further comprising:
a synchronization circuit which synchronizes said strobe signal and a clock signal, and outputs said strobe signal being synchronized with said clock signal, to said delay controller.

18. A method, comprising:
counting a frequency of an input of a first signal;
generating a second signal by adding a delay to said first signal, said delay corresponding to said frequency; and
halting said counting said frequency, when a phase difference between said first signal and said second signal is a predetermined value.

19. The method according to claim 18, further comprises:
asserting a control signal while said phase difference is smaller than said predetermined value, said control signal indicating that said frequency is being counted; and
halting said counting said frequency when said control signal is negated.

20. The method according to claim 18, further comprising:
asserting a control signal while said second signal is at a high level at a timing of a falling edge of said first signal, said control signal indicating that said counter counts said frequency; and
halting said counting said frequency when said control signal is negated.

21. The method according to claim 18, further comprising:
asserting a control signal while said second signal is at a low level at a timing of a rising edge of said first signal, said control signal indicating that said frequency is being counted; and
halting said counting said frequency when said control signal is negated.

22. The method according to claim 18, further comprising:
receiving a timing signal which comprises a phase reversal signal of said first signal;
capturing said second signal at a timing of a rising edge of said timing signal; and
outputting said captured second signal, said captured signal indicating whether said frequency is being counted or not.

23. The method according to claim 22, wherein said delay added to said first signal is smaller than a phase difference of substantially 180 degrees between said first signal and said second signal,
said method further comprising:
outputting said captured second signal indicating that said counting halts counting said frequency when said delay reaches to substantially 180 degrees.

24. The method according to claim 18, further comprising:
generating said second signal by adding a first delay to said first signal, said first delay corresponding to said frequency; and
generating a third signal by adding a second delay to said first signal, said second delay corresponding to an adjusting value, said adjusting value being calculated by dividing said frequency by an arbitrary integer.

25. The method according to claim 18, further comprising:
synchronizing said first signal and a clock signal; and
outputting said first signal being synchronized with said clock signal for generating said second signal.

* * * * *